US005173943A

United States Patent [19]

Dzurko

[11] Patent Number: 5,173,943

[45] Date of Patent: Dec. 22, 1992

[54] COMPACT SUBWOOFER WITH EXCEPTIONAL LOW FREQUENCY RESPONSE

[75] Inventor: Michael J. Dzurko, La Crosse, Wis.

[73] Assignee: Audio Concepts, Inc., La Crosse, Wis.

[21] Appl. No.: 811,265

[22] Filed: Dec. 20, 1991

[51] Int. Cl.[5] .......... H03G 5/00

[52] U.S. Cl. .......... 381/98

[58] Field of Search .......... 381/98, 99, 111, 116, 381/117, 88, 89, 90

[56] References Cited

U.S. PATENT DOCUMENTS 3,988,541 10/1976 Boast .......... 381/98
4,128,738 12/1978 Gallery .......... 381/99
4,843,625 6/1989 King .......... 381/98

*Primary Examiner*—Forester W. Isen
*Attorney, Agent, or Firm*—Robert J. Harter

[57] ABSTRACT

A compact subwoofer with exceptionally low distortion at 30 Hz and below is provided by a unique combination of system Q and an unconventional synthesized bandpass filter. The speaker has a system Q of 1.2 which is unusually high for a high quality, low distortion system. Nonetheless, a high Q with low distortion is made possible by the novel filter which has an oversized inductor and capacitor to provide a low-pass corner frequency nearly equal to the system resonant frequency. The result is a surprisingly broad, flat response at extremely low frequencies.

14 Claims, 1 Drawing Sheet

COMPACT SUBWOOFER WITH EXCEPTIONAL LOW FREQUENCY RESPONSE

BACKGROUND OF THE INVENTION

1. Field Of The Invention

The subject invention generally pertains to speakers and more specifically to those operating in the lower frequencies of around 30 Hz.

2. Description Of Related Art

High quality speakers typically operate at a system Q ($Q_{tc}$) of between 0.5 and 1.0. This generally provides a nice uniform, flat response curve. Bandpass filters used in such systems have relatively small inductors to provide a low pass corner frequency that is typically well over twice the system resonance (Fc). The greatest disadvantage of such systems is that with the low $Q_{tc}$ a significant portion of the lower frequency response is lost. A secondary concern is the loss in efficiency, again due to the low $Q_{tc}$.

Many inexpensive, low quality speakers operate with a much higher $Q_{tc}$. Although such systems are very efficient at delivering the most sound for a given input, the sound is usually very distorted and comes across as a "booming" sound. The response curves typically have an annoying peak near its resonant frequency Still other speakers achieve a broad low frequency response by way of enormous enclosures which typically provide a low system resonant frequency. Various baffle schemes are also used. However, such mechanical means of capturing the low frequencies are generally more expensive to produce.

SUMMARY OF THE INVENTION

To overcome limitations and problems of current speakers, it is an object of the invention to provide a compact speaker of less than 3 $ft^3$ which is effective at delivering lower frequency sounds at minimal distortion.

Another object is to provide a speaker with a system $Q_{tc}$ of 1.1 to 1.5 and a bandpass filter with a low pass corner frequency of less than 130% of the system resonant frequency $F_c$ to ensure a broad flat response curve at the lower frequencies.

A further object of the invention is to provide a compact 2 $ft^3$ speaker with a broad flat response curve at 30 Hz.

Yet another object is to provide a miniature 0.5 $ft^3$ speaker with a broad flat response curve at 60 Hz and below.

These and other objects of the invention are provided by a novel speaker having a system $Q_{tc}$ of 1.1 to 1.5. The speaker's enclosure has a vented internal volume of less than 3 cubic feet. The speaker with its filter has a resonant frequency and low pass corner frequency of less than 35 Hz. The filter includes an inductor having an inductance greater than 22 mh and includes a capacitor having a capacitance greater than 300 mfd.

DESCRIPTION OF THE PREFERRED EMBODIMENT

Figure 1:
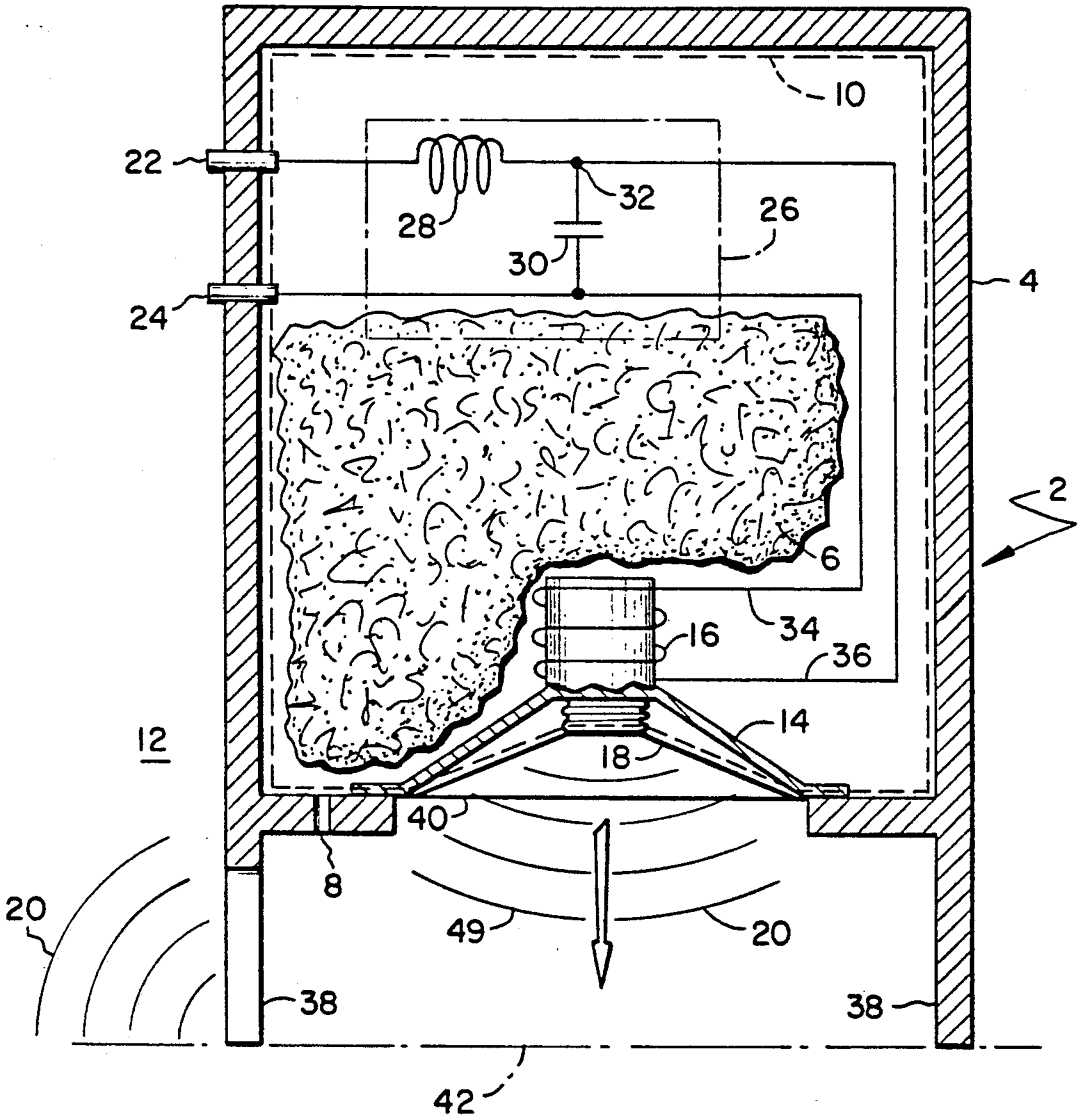
FIG. 1 is a cross-sectional view of the subject invention.

Speaker 2 of FIG. 1 includes an enclosure 4 made of particle board. Enclosure 4 is substantially filled with damping material 6 such as bonded dacron. One example of damping material 6 would be 0.75 bonded fiber =22.0406 available through Airtex Industries, Inc. of Minneapolis, Minn. A vent 8 places the internal volume 10 of enclosure 4 in fluid communication with the atmosphere 12 surrounding speaker 1. Enclosure 4 houses a sound projecting driver 14 that includes a coil 16 and cone 18 arrangement for converting an electrical input signal to sound 20 Speaker 2 also includes a first input node 22 and a second input node 24 for receiving electric input signals from an amplifier (not shown). Input nodes 22 and 24 are coupled to coil 16 by way of a unique bandpass filter 26.

Filter 26 includes an inductor 28 coupled to a capacitor 30 at a third node 32. The other end of inductor 28 is coupled to the first input node 22, and the other end of capacitor 30 is coupled to the second input node 24. One lead 34 of driver coil 16 is coupled to the second input node 24 and the other lead 36 is coupled to the third node 32.

With a unique combination of filter and speaker parameters, surprising and unexpected sound quality is realized at unusually low frequencies. The enclosure volume 10, damping (e.g., damping material 6), driver Q ($Q_{ts}$) and filter series resistance (DC resistance of inductor 28) are chosen to provide a rather high system Q ($Q_{tc}$) of 1.1 to 1.5. Then to offset the narrow and distorted peak response often associated with high $Q_{tc}$ and to provide a relatively wide and flat low frequency response, the inductance of inductor 28 and DC resistance of coil 16 are selected to provide a low pass corner frequency of approximately less than 130% of the system resonant frequency Fc.

In one embodiment of the invention, volume 10 is 0.5 $ft^3$ and is substantially filled with damping material 6. The mech/elec $Q_{ts}$ of driver 14 is 0.7 and the DC resistance of inductor 28 is 0.8 ohms. The resulting system $Q_{tc}$ is approximately 1.2 with a system resonant frequency $F_c$ of approximately 58 Hz. The chosen inductor 28 has an inductance of 16.5 mh and driver 14 has a nominal coil resistance of 8 ohms. The inductor and driver coil resistance combination provides a low pass corner frequency of 77 Hz which is approximately 130% of the 58 Hz resonant frequency Fc. Further, capacitor 30 was selected to have a capacitance of 200 mfd to provide a cross over frequency of 125 Hz.

The chosen inductance and capacitance values of filter 26 are unusually large, yet their selections were not arbitrary. It's been found that for relatively small speaker enclosures (e g., less than 3 $ft^3$), the system resonance Fc can be approximated as a function of speaker volume 10 ($Fc<75-20$ V; where V is the internal volume 10 in $ft^3$ and Fc is in Hz).

By experimentation with surprising and unexpected results, it's been found that filters having a low pass corner frequency "no more than sightly above" the system resonant frequency Fc offsets the adverse effects of high $Q_{tc}$ systems. "No more than slightly above" has been determined by experimentation to be at least partially a function of the internal volume 10 of enclosure 4. More specifically, "no more than slightly above" is considered as a dimensionless multiplier "m" defined by the empirical equation: $m=(1.5.-0.33\ V)$; where V is the internal volume 10 in $ft^3$. With that in mind, the inductance value of inductor 28 is chosen to be at least $R/[(2)(3.14)(m)(Fc)]$; where R is the DC resistance of driver coil 16 in ohms, m is the dimensionless multiplier and Fc is the system resonance in Hz. Substituting for m and Fc, the net inductance value would be at least $R/(0.042\ V^2-0.35\ V+0.7)$.

To provide a complete bandpass filter 26, capacitance is added. The capacitance value is typically chosen at least partially as a function of the system resonance Fc. Since Fc varies as a function of the enclosure's volume 10 which in turn is used to specify the value of inductor 28, it follows that the capacitance can be chosen as a function of the value of the inductance. This relationship has been experimentally found and defined by the empirical equation: $C>[(17)(L)-(140)]$; where L is the inductance of inductor 28 in millihenries and C is the capacitance of capacitor 30 in microfarads.

In a second embodiment of the invention, the parameters of speaker 2 include a system $Q_{tc}$ of 1.2, a stuffed and vented internal volume 10 of 2 $ft^3$, driver coil resistance of nominally 4 ohms (two 8 ohm coils in parallel), inductor 28 having an inductance of 26 mh, capacitor 30 having a capacitance of 400 mfd, driver $Q_{ts}$ of 0.32. system resonance Fc of 27.9 Hz, cross-over frequency of 90 Hz low pass corner frequency of 24 Hz, and a DC resistance of inductor 28 of 1.8 ohms. In particular, driver 14 is a model DV12 Woofer available through Meniscus Speakers of Wyoming, Mich. and AC Components of La Crosse, Wis. The specifications of one particular driver 14 include: voice coil =50 mm diameter; Former=Kapton; height of F.C.=30.61 mm., height of air gap =9.525 mm; Xmax=10.54 mm; Impedence=4 ohms (dual 8 ohm coils in parallel); Dcr=6.1 ohms; cone body=felted paper; surround=RR2550 butyl rubber; magnet mass=1700 grams; SD meters=0.0545 square meters; inductance=1.85 mh; $F_s$=15 Hz; Mmd=125 grams; BL=9.88 Tesla Meters/Newton; Qms=3.96; Qes=0.344; Qts=0.322; and Vas=414 liters.

It's been found that the subject invention lends itself well to downward sound projection systems. Protrusions 38 on enclosure 4 serve to elevate the face 40 of driver 14 at least 1.5" above floor 42. Projecting sound waves 44 downward against floor 42 serves to further promote the flat response at the low frequencies.

Although the invention is described with respect to a preferred embodiment, modifications thereto will be apparent to those skilled in the art. Therefore, the scope of the invention is to be determined by reference to the claims which follow.

I claim:

1. A speaker comprising:
a first input node;
a second input node..
a third node;
an inductor coupled to said first node and said third node;
a capacitor coupled to said second input node and said third node; and
a driver connected to an enclosure and coupled to said second input node and said third node, said inductor having a millihenry inductance value greater than $R/(0.042\ V^2-0.35\ V+0.7)$ where R is the resistance of the driver in ohms and V is the internal volume of the enclosure in cubic feet.

2. The speaker as recited in claim 1, wherein the microfarad capacitance of said capacitor is greater than $(17)(L)-(140)$ where L is the inductance of said inductor in millihenries.

3. The speaker as recited in claim 2, wherein the inductance of said inductor is greater than 24 millihenries and the capacitance of said capacitor is greater than 350 microfarads.

4. The speaker as recited in claim 1, further comprising protrusions on said enclosure adapted to hold said driver at least 1.5 inches above a floor and situated to directly project sound primarily toward said floor.

5. The speaker as recited in claim 4, wherein the inductance of said inductor is greater than 24 millihenries and the capacitance of said capacitor is greater than 350 microfarads.

6. The speaker as recited in claim 1, wherein the internal volume of said enclosure is at least half filled with a damping material and said internal volume is vented to atmosphere.

7. The speaker as recited in claim 6 wherein the inductance of said inductor is greater than 24 millihenries and the capacitance of said capacitor is greater than 350 microfarads.

8. A speaker comprising:
a first input node;
a second input node;
a third node;
an inductor coupled to said first node and said third node;
a capacitor coupled to said second input node and said third node; and
a driver connected to an enclosure and coupled to said second input node and said third node, said inductor having a millihenry inductance value greater than $R/(0.042\ V^2-0.35\ V+0.7)$ where R is the resistance of the driver in ohms and V is the internal volume of the enclosure in cubic feet, said capacitor having a microfarad capacitance value greater than $(17)(L)-(140)$ where L is the inductance of said inductor in millihenries.

9. The speaker as recited in claim 8, further comprising protrusions on said enclosure adapted to hold said driver at least 1.5 inches above a floor and situated to directly project sound primarily toward said floor.

10. The speaker as recited in claim 9, wherein the inductance of said inductor is greater than 24 millihenries and the capacitance of said capacitor is greater than 350 microfarads.

11. The speaker as recited in claim 8, wherein the internal volume of said enclosure is at least half filled with a damping material and said internal volume is vented to atmosphere.

12. The speaker as recited in claim 11, wherein the inductance of said inductor is greater than 24 millihenries and the capacitance of said capacitor is greater than 350 microfarads.

13. A speaker comprising:
a first input node;
a second input node;
a third node;
an inductor coupled to said first input node and said third node;
a capacitor coupled to said second input node and said third node;
a substantially downwardly projecting driver housed in a vented enclosure whose internal volume is at least half filled with a damping material, said driver being coupled to said second input node and said third node, said inductor having a millihenrie inductance value greater than $R/(0.042\ V^2-0.35\ V+0.7)$ where R is the resistance of the driver in ohms and V is the internal volume of the enclosure in cubic feet, said capacitor having a microfarad capacitance value greater than $(17)(L)-(140)$ where L is the inductance of said inductor in millihenries.

14. The speaker as recited in claim 13, wherein the inductance of said inductor is greater than 24 millihenries and the capacitance of said capacitor is greater than 350 microfarads.

* * * * *